United States Patent [19]
Bebak et al.

[11] Patent Number: 5,456,942
[45] Date of Patent: Oct. 10, 1995

[54] METHOD FOR FABRICATING A CIRCUIT ELEMENT THROUGH A SUBSTRATE

[75] Inventors: James E. Bebak, Hamburg, N.Y.;
Loren E. Saar, Elmwood Park, Ill.;
Frank A. Sardina, Freedom, N.Y.;
Joseph J. Vinci, Snyder, N.Y.

[73] Assignee: Motorola, Inc., Schaumburg, Ill.

[21] Appl. No.: 128,916

[22] Filed: Sep. 29, 1993

[51] Int. Cl.⁶ ........................................ B05D 5/12
[52] U.S. Cl. ........................... 427/97; 427/294; 427/296; 427/282; 427/299; 427/384
[58] Field of Search .................. 427/97, 294, 296, 427/282, 299, 384

[56] References Cited

U.S. PATENT DOCUMENTS

| | | | |
|---|---|---|---|
| 3,999,004 | 12/1976 | Chirino | 427/97 |
| 4,323,593 | 4/1982 | Tsunashima | 427/97 |
| 4,642,160 | 2/1987 | Burgess | 427/97 |
| 4,964,948 | 10/1990 | Reed | 427/97 |

*Primary Examiner*—Shrive Beck
*Assistant Examiner*—David M. Maiorana
*Attorney, Agent, or Firm*—Nicholas C. Hopman

[57] ABSTRACT

An improved method for fabricating a circuit element through a substrate permits fabrication of large geometry vias between substrate sides. The improved method includes disposing a substrate (327) between two compressible layers (317, 339). Each of the layers (317, 339) has at least one aperture (345, 321) disposed therethrough. The substrate (327), has at least one via (333) aligned between the apertures (345, 321) where the via has an area smaller than an area of the apertures (345, 321). Next, a coating, preferably a liquid circuit element material (351) is disposed into one of the apertures (321) of one of the two compressible layers (339). A pressure (405) is applied between the two compressible layers (317, 339) causing the liquid circuit element material (351) to flow between the two compressible layers (317, 339), thereby coating the at least one via (333) of the substrate (327), thus providing an interconnect (609, 611) of the coating through the substrate (327). The compressed layers (317, 339) confine the spreading of the liquid circuit element material (351). Preferably, the substrate (327) is then cured or fired, thereby changing the liquid circuit element material (351) into a solid state.

8 Claims, 4 Drawing Sheets

METHOD FOR FABRICATING A CIRCUIT ELEMENT THROUGH A SUBSTRATE

FIELD OF THE INVENTION

This invention is generally directed to the field of circuit substrate fabrication and is useful for forming a circuit element through a circuit substrate.

BACKGROUND OF THE INVENTION

Contemporary circuit bearing substrates comprise those based on glass epoxy printed circuit boards, polyimide based flexible substrates, paper based printed circuit boards, polymer based substrates, and alumina based hybrid circuits. All of these technologies are employed to attach and interconnect various discrete electrical components to form a complete module or sub-assembly.

Miniaturization requirements drive these packaging technologies to resort to two-sided and multi-layer implementations. Because of this, these circuits require not only the traditional planar interconnect structures but also inter-layer and inter-side electrical connections.

FIG. 1 illustrates a prior art method for constructing a via between multiple layers, in this case two outer sides of an alumina substrate. This is accomplished by using an off-contact printing process. This process is limited to providing small area, or small cross-sectional area vias, has many steps making it costly to manufacture, and is prone to poor manufacturing yields.

Generally, a bottom surface 101 of an alumina substrate 103 is disposed onto a top surface of a fixture 105. A through-hole, or via 107 is provided through the alumina substrate 103. This via 107 may be die cut when the alumina substrate 103 is green, or laser drilled after the green alumina is fired. A stainless steel mesh screen, with selective masking in the form of an emulsion, 109 is positioned just above a top surface of the alumina substrate 103. Two apertures 113, 115 are positioned aligned over the via 107. These apertures represent areas of the screen 109 without the emulsion masking. A centered area 117 is shown directly above the center of the via 107 and is employed as a mask area. Without this centered mask area 117 a large blob of ink 119 would adhere to the bottom side of the screen 109 proximate the apertures 113 and 115. If it does, then the ink would smear when the screen 109 is later removed. This smearing is commonly referred to as back side splashing. This will cause problems as described later.

In a first step, a conductive material 119, typically a thick-film type ink is disposed on a top surface 121 of the screen 109. A squeegee 123 is utilized to distribute a portion of the ink 119 into the via 107 as the squeegee 123 transits in a direction indicated by reference number 125.

As the process proceeds, as shown in step 2, the squeegee 123 moves, and the ink 119 gets pushed across the top surface 121 of the screen 109. Notice that the screen starts to deform and move toward the top side 111 of the alumina substrate 103 as a result of the pressure applied to the squeegee 123.

Then, in step 3, the ink 119 gets forced into the aperture 113 through the action of the squeegee 123 and gravity. As the process continues, in step 4 the ink 119 gets forced into the aperture 115.

Then, in step 5 the squeegee is removed, and the screen 109 springs back to its original position. Note that the ink 119 is now positioned at the top of the via 107. As mentioned above, without the centered mask area 117, a large blob of ink would form on the bottom side of the screen 109. If this was allowed to happen, then this blob of ink could form a bridge between the bottom of the screen 109 and the top edge of the via 107. When the screen 109 is pulled away from the alumina substrate 103 this blob would smear onto the top side 111 of the alumina substrate 103. This is undesirable and would cause manufacturing yield problems. The centered mask area 117 is therefore required in an off-contact printing process. Detriments of the centered mask area 117 will be described later.

Next, in step 6, after the screen 109 is removed, a vacuum is drawn, as shown by the arrow 127, through the via 107. As a result the ink 119 is drawn downward along an inner wall 129 of the via 107. Because the amount of ink was necessarily limited by the centered mask area 117 there is an insufficient amount to transition completely down the inner wall 129 of the via 107 to the bottom of the alumina substrate 103. This is the primary detriments of the centered mask area 117. Note that the ink 119 is not shown on the face of the inner wall 129 of the via 107 for illustration clarity only.

Because there is an insufficient amount of ink 119 to transition completely down the inner wall 129 of the via 107 to the bottom of the alumina substrate 103, the first six steps of the process must be repeated with the alumina substrate 102 inverted. These process steps are shown in FIG. 1 in steps 7 through 12.

Even though this lengthy process will work for vias having small cross-sections, it will not work for vias having large cross-sections such as those used to carry heavy currents.

FIG. 2 shows one prior art method for creating a relatively large oblong via with a small cross-sectional area. Reference number 201 represents a substrate and reference number 203 shows a sectioned elongated via. This type of via is difficult and expensive to fabricate in a production environment because tooling for green tape punching is impractical to fabricate for an alumina substrate. In this case one must resort to laser drilling which is much more expensive.

What is needed is an improved method for fabricating a circuit element through a substrate. The improved method should have fewer steps and allow for easy to fabricate large cross-sectional geometries for vias.

DETAILED DESCRIPTION OF A PREFERRED EMBODIMENT

Figure 1:
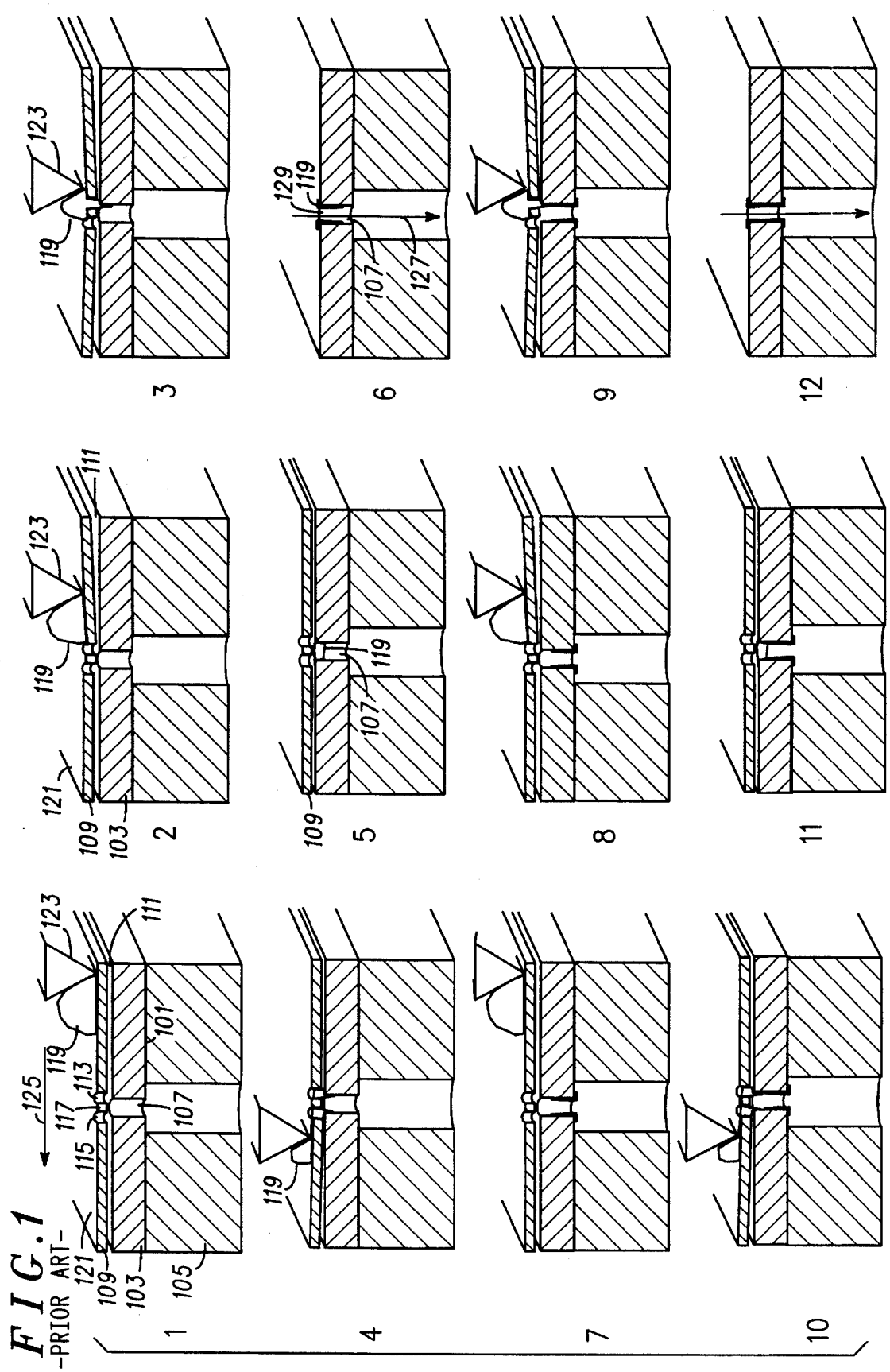
FIG. 1 is an illustration of a prior art fabrication method for providing a conductive element through a substrate.
Figure 2:
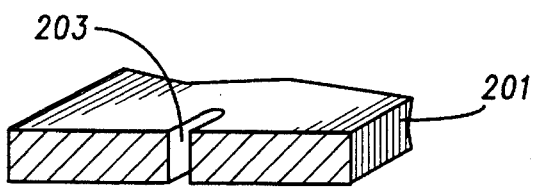
FIG. 2 is an illustration of a prior art fabrication method showing a slotted via disposed through a substrate.

An improved method for fabricating a circuit element through a substrate permits fabrication of large geometry vias between circuit bearing substrate sides. These vias may be coated with a conductive, resistive, or dielectric coating depending on the specific application. In the preferred embodiment a thick-film hybrid substrate is constructed. Thick-film hybrid substrates are used to host various circuit elements including conductive traces, ink deposited resistors, and electrical components. Alternatively, the substrate may be constructed of many other types of circuit bearing substrates. These may include, but are not limited to; glass epoxy printed circuit boards, polyimide based flexible substrates, paper based printed circuit boards, and polymer based substrates. Applications demanding smaller package size require two-sided and multi-layer implementations. Because of this, these substrates require not only the traditional planar interconnect structures but also inter-layer and inter-side electrical connections, commonly known as vias. Prior an schemes for providing these inter-layer and inter-side electrical connections are restricted because they are limited to constructing only small cross-section vias. As mentioned above, the improved method permits fabrication of large cross-sectional geometry vias between substrate sides. These large cross-sectional geometries are constructed by using an on-contact printing method substituting stencils for the traditional screens used in the prior art off-contact printing method.

The improved method includes disposing a substrate between two, compressed, compressible layers. Each of the layers has at least one aperture disposed therethrough. The substrate, has at least one via aligned between and surrounded by the apertures. Next, a coating, preferably a liquid circuit element material such as an ink, is disposed into one of the apertures of one of the two compressible layers. A pressure is applied between the two compressible layers causing the liquid circuit element material to flow between the two compressible layers, thereby coating the at least one via of the substrate, thus providing an interconnect through the substrate. As noted above this interconnect may optionally be resistive or dielectric in nature if desired. Preferably, many vias are used to interconnect various electrical components on opposing sides of the substrate. The compressed layers confine the lateral spreading of the liquid circuit element material, functioning as a gasket. Conventionally, the substrate is then fired thereby curing the liquid circuit element material, transforming it into a solid state.

This method is not only significantly simpler than the off-contact printing method of the prior art, but also permits the fabrication of large cross-sectional area vias because it enables the necessarily large amounts of ink to be disposed into the substrate's via while preventing the lateral spreading of the ink on the opposing surfaces of the substrate.

Figure 3:
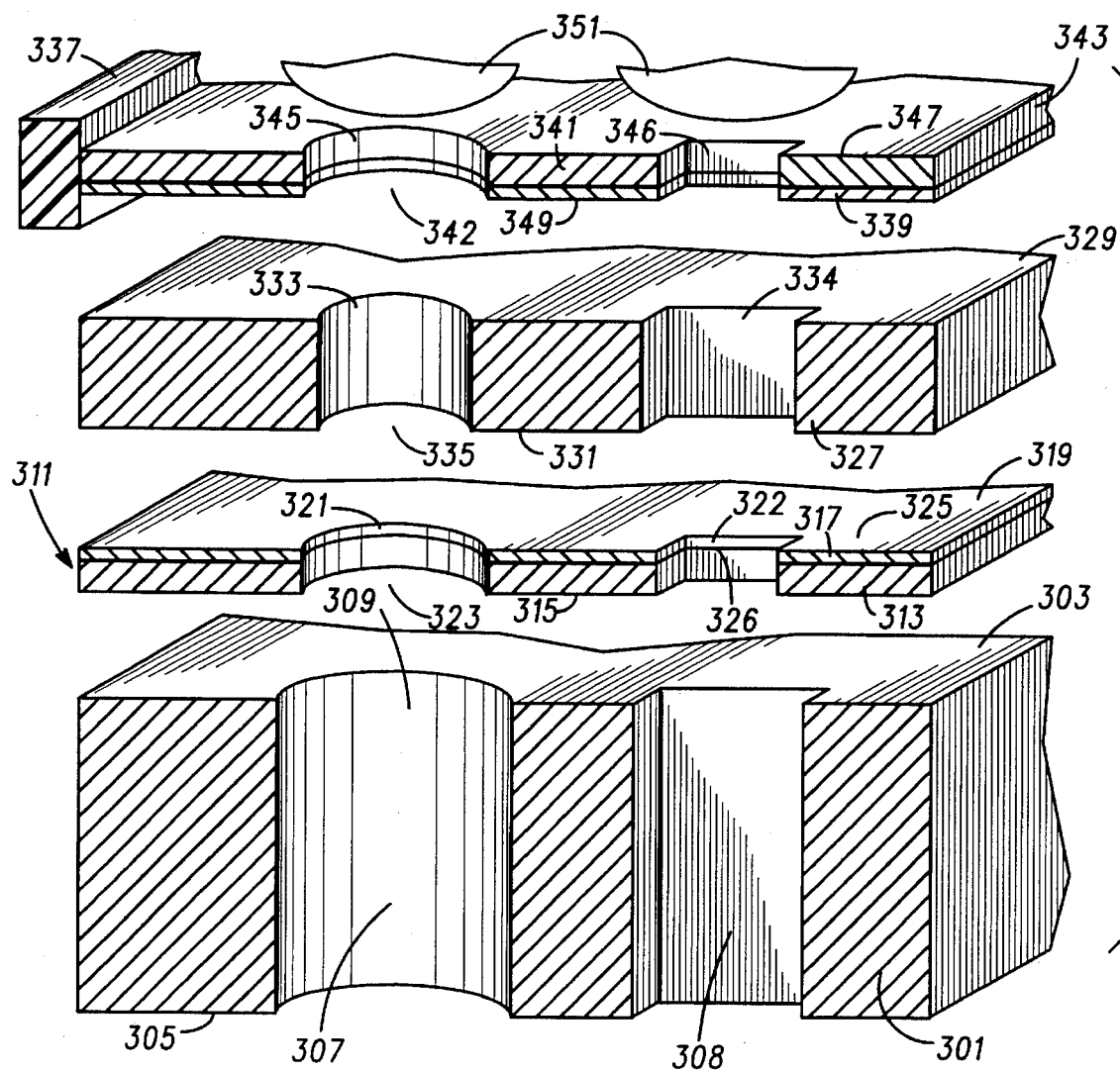
FIG. 3 is a diagram showing an exploded view of the various elements used in the preferred method.
Figure 4:
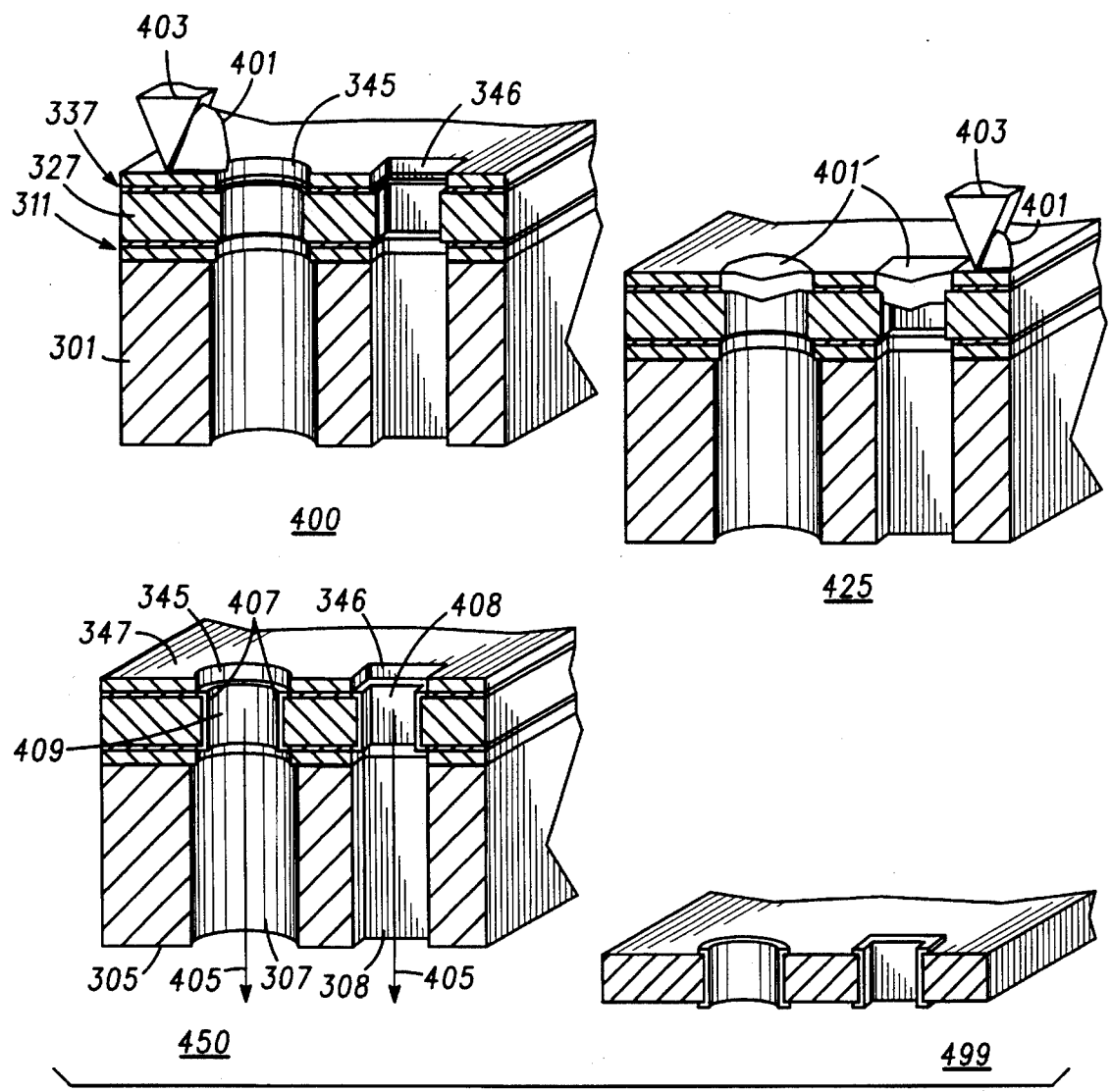
FIG. 4 is a diagram showing details of various method steps in accordance with the present invention.

A more detailed understanding of the improved method can be realized by reviewing the steps represented in FIGS. 3 and 4. FIG. 3 is a diagram showing an exploded view of the various elements used in the preferred method, and FIG. 4 is a diagram showing details of various method steps. As mentioned above, in the preferred embodiment a thick-film hybrid substrate is constructed. Given the teaching here, other substrates may be used. These include, but are not limited to glass epoxy printed circuit boards, polyimide based flexible substrates, paper based printed circuit boards, and polymer based substrates.

Starting with FIG. 3, a nesting fixture 301 is used to support the apparatus that follow. The nesting fixture 301 is constructed from a dimensionally stable material, preferably machined aluminum. Between a first surface 303 and an opposing second surface 305, the nesting fixture has a circuit pattern formed as a multiplicity of apertures or vias extending from the first surface 303 to the opposing second surface 305. Although a singular via is possible, typically many vias make up a circuit pattern. These vias correspond to the same vias that will later be formed in the substrate. Each via of the first multiplicity of vias 307, 308 has a geometric shape bounded by a first area 309 on the first surface 303. The geometric shape of this first area 309 may be circular, square, slotted, or any other geometric shape deemed necessary. Also, the first area of the vias may be different, or the same, on the first surface 303 and the opposing second surface 305 depending on the application.

A non-framed stencil 311 is disposed on the first surface 303 of the nesting fixture 301. The non-framed stencil 311 includes a rigid layer 313, and a compressible layer 317. The rigid layer 313 has a first surface 3 15 contacting the first surface 303 of the nesting fixture 301. The rigid layer 313 is constructed of a dimensionally stable material. Preferably this material is stainless steel. Alternatively this material may be brass, phosphor bronze, or another dimensionally stable material. The thickness of the stencil is typically about 0.010". The compressible layer 3 17 may be constructed of different materials. In the preferred embodiment the compressible material is an emulsion material disposed on an opposing second surface 319 of the rigid layer 313. Typically, the emulsion is coated onto the metal layer and a photolithographic process is used to define a circuit pattern through the emulsion and the metal layers. Various emulsion materials are commonly used in thick-film hybrid processing to define patterns on a screen. Most any emulsion will be suitable here. The emulsion thickness is about 0.004". Of course, other compressible materials may be substituted for the emulsion material. The non-flamed stencil 311 has a second multiplicity of vias 321,322 arranged in the same circuit pattern as the nesting fixture 301, disposed therethrough. Each via of the second multiplicity of vias 321, 322 is formed extending from a first surface 325 of the compressible layer 317 to the first surface 315 of the rigid layer 313. Also, each via of the second multiplicity of vias 321, 322 has a geometric shape bounded by a second area 323, 324 on the first surface 325 of the compressible layer 317, and the first surface 315. The second area 323 is smaller than the first area 309 associated with the first multiplicity of vias 307, 308 of the nesting fixture 301. The disposing of the non-framed stencil 311 onto the nesting fixture 301 aligns the first and second multiplicity of vias 307, 308, 321, and 322. Preferably, the second multiplicity of vias 321, 322 are centered and surrounded by the first multiplicity of vias 307, 308.

A substrate 327, in this case alumina based, is disposed on the first surface 325 of the compressible layer 317 of the non-framed stencil 311. The substrate 327 has a first surface 331 contacting the first surface 325 of the compressible layer 317 of the non-framed stencil 311, and an opposing second surface 329. The substrate 327 has a third multiplicity of vias 333, 334 arranged in the circuit pattern disposed therethrough. Each of the third multiplicity of vias 333, 334 is formed extending from the first surface 331 to the opposing second surface 329. Also, each of the third multiplicity of vias 333, 334, has a geometric shape bounded by a third area 335 On the first surface 331 and the opposing second surface 329. The third area 335 is smaller than the second area 323 associated with the second multiplicity of vias 321, 322 of the non-framed stencil 311. The disposing of the substrate 327 onto the non-framed stencil 311 aligns the second and third multiplicity of vias 321, 322, 333, and 334. Preferably, the third multiplicity of vias 333, 334 are centered and surrounded by the second multiplicity of vias 321, 322.

A framed stencil 337 is disposed onto the opposing second surface 329 of the substrate 327. The framed stencil 337 includes a second surface 349 of a second compressible layer 339 contacting the opposing second surface 329 of the substrate 327, and a second rigid layer 341 disposed on an opposing first surface 343 of the second compressible layer 339. The framed stencil 337 has a fourth multiplicity of vias 345, 346 arranged in the circuit pattern disposed therethrough. Each via of the fourth multiplicity of vias 345, 346 is formed extending from a second surface 349 of the second compressible layer 339 to an opposing fourth surface 347 of the second rigid layer 341. Each via of the fourth multiplicity of vias 345, 346 has a geometric shape bounded by the second area 323, 324 of each via of the second multiplicity of vias of the non-framed stencil 311. Although the sameness between the second area 323, 324 of the non-framed stencil 311 and the area of each via of the fourth multiplicity of vias 345, 346 is not strictly required it is preferred. What is necessary, is that the substrate's vias 333, 334 are laterally surrounded by each of the non-framed stencil's 311 and the framed stencil's 337 vias 321, 322, 345, and 346. The disposing of the framed stencil 337 onto the substrate 327 aligns the third and fourth multiplicity of vias 333, 334, 345, and 346.

Then, the nesting fixture 301, the non-framed stencil 311, the substrate 327, and the framed stencil 337, are compressed. This causes the compressible layer 317 of the non-framed stencil 311 and the compressible layer 339 of the framed stencil 337, to be compressed about the first surface 331 and the opposing second surface 329 of the substrate 327. This forms a seal laterally surrounding the vias 333 and 334 which is particularly advantageous, as described below.

Next, a liquid circuit element material 351 is disposed into the fourth multiplicity of vias 345, 346 of the framed stencil 337. Since in the preferred embodiment a alumina based thick-film hybrid circuit is used, this liquid circuit element material 351 is comprised either of a polymer or cermet thick-film ink. There are many techniques of disposing the ink into the circuit pattern associated with the vias 345, 346. Typically, in the processing of thick-film hybrid circuits, this ink is disposed using a squeegee. The deposition of the ink is shown in FIG. 4.

Reference number 400 shows the result of the above steps of providing the nesting fixture 301, disposing the non-framed stencil 311, disposing the substrate 327, and disposing the framed stencil 337.

Next, the ink 401 is disposed on the framed stencil 337. A squeegee 403 is used to spread the ink 401 into the fourth multiplicity of vias 345 and 346. After the squeegee 403 has been drawn across the vias 345 and 346, as shown in the next step 425, a portion of the ink 401' remains in the vias 345 and 346. Note that the amount of ink 401' left in the vias 345 and 346 is significantly more than in the prior art scheme.

Figure 6:
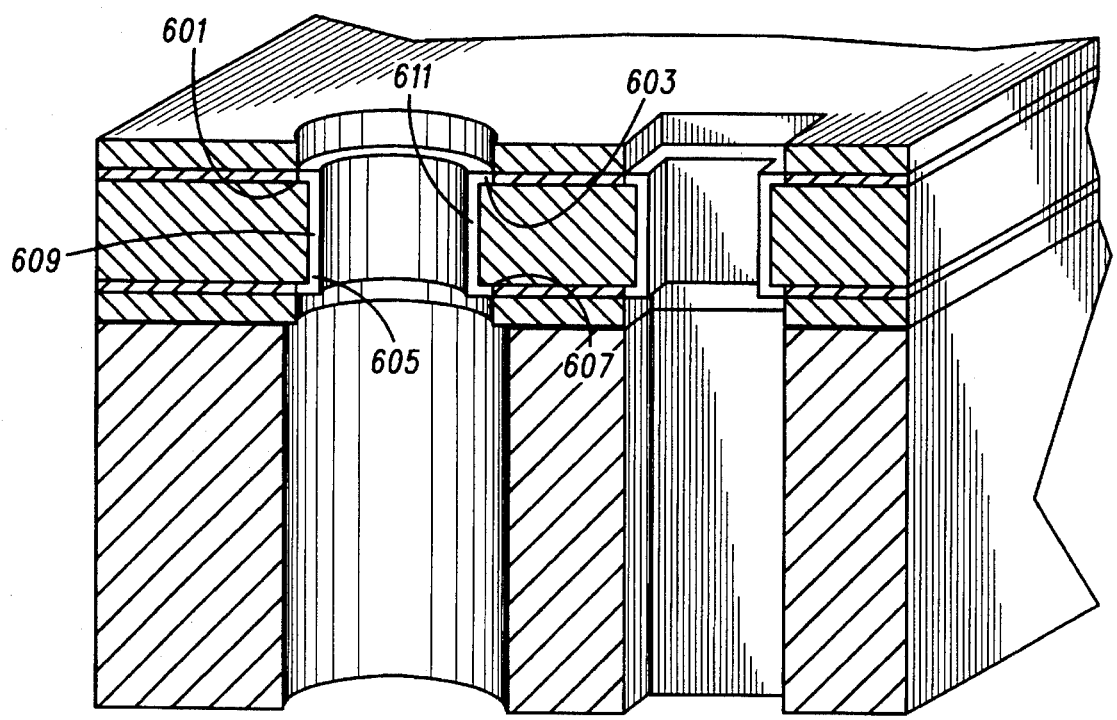
FIG. 6 is a magnified view of the result of the method steps shown in FIG. 4.

Because of the seal formed by the compressible layer 339 of the framed stencil 337 surrounding the vias 333, and 334 on the opposing second surface 329 of the substrate 327, the ink 401' will not laterally flow past a dam created by the compressible layer 339. This can be clearly seen at reference numbers 601, 603, 605, and 607 in FIG. 6. It is not possible to dispose such a large quantity of ink with the prior art off-contact printing scheme. This is because, if a large quantity of ink is used for processing a substrate, then some of the large quantity of ink would remain on the bottom fringes of the screen's via pattern after the squeegee was pushed/pulled past the via and the screen was released from the surface of the substrate. Then, when a subsequently processed substrate was placed below the screen, the ink that remained on the bottom fringes of the screen's via pattern from the previous operation would flow onto this substrate. This is because before the squeegee forces the screen into contact with the substrate, thereby causing a barrier preventing the newly squeegeed ink from flowing laterally beyond the via, the ink that remained on the bottom fringes of the screen's via pattern from the previous operation would flow laterally unbounded across the surface of the new substrate, thereby creating an undesirable smear of ink on its surface. That more ink is disposed here is a prime reason that larger area cross-sectional vias can be constructed.

Next, in step 450, a drop in pressure is provided 405 between the opposing fourth surface 347 of the second rigid layer and the opposing second surface 305 of the nesting fixture 301. In the preferred embodiment a vacuum is drawn.

This action will draw the ink 401' between the fourth multiplicity of vias 345, 346, and the first multiplicity of vias 307, 308 thereby providing an interconnect 407 between the first surface 331 and the opposing second surface 329 of said substrate 327. This can be clearly seen at reference numbers 609 and 611 in FIG. 6. Note that the conductive interconnect 407 will actually completely fill the via 333 as shown in the case of the conductive via 334 by reference number 408. To make the illustration clearer the ink 401' is not show on the wall 409.

Because of the seal formed by the compressible layer 317 of the non-framed stencil 311 surrounding the vias 333, and 334 on the first surface 331 of the substrate 327, the ink 401 will not laterally flow past the dam created by the compressible layer 317. In the prior art scheme, since the amount of ink is limited to prevent the smearing of ink, it was not possible to draw enough ink at a high enough vacuum to cover the complete via 345 from the first surface 331 to the opposing second surface 329. Further, the improved method, based on on-contact printing, prevents the flow of ink past the dam created by the compressible layer 317 of the non-framed stencil 311.

This improved method permits the construction of vias well beyond the practical limit of about 0.030" vias found in the prior art. Vias of 0.045" and larger can be easily fabricated. Principally this is because of 1) the larger amount of ink disposable in the via, 2) the higher level of vacuum the fixturing allows for, and 3) the superior masking provided by the dams created by the construction of the framed and non-framed stencils.

In a next step 499 the substrate 327 is removed and fired or cured in a conveyorized furnace. For polymer thick-film inks the curing temperature is typically 300° C. For cermet thick-film inks the firing temperature is typically 850° C. After firing, the ink is fired or cured substrate is ready for placement of electrical components.

Note that although in the preferred embodiment a fixturing method including the application of ink by a squeegee has been described, other methods and fixtures may be devised that have equivalent performance. For instance if the substrate is surrounded by compressible layers, the ink may be sprayed into the vias.

Figure 5:
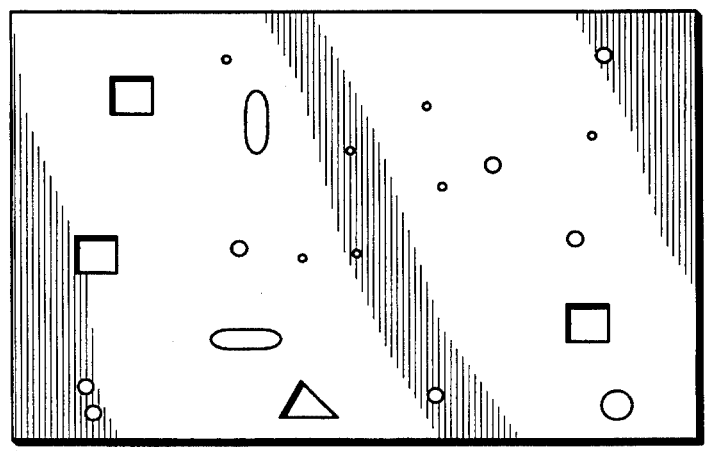
FIG. 5 is a diagram showing various geometries for vias in accordance with the present invention.

FIG. 5 shows possible various geometries for vias that may be constructed using the described method.

In conclusion, an improved method includes disposing a substrate between two compressible layers having at least one aperture disposed therethrough. The substrate, has at least one via aligned between the apertures. Next, a liquid circuit element material, preferably a thick film ink, is disposed into one of the apertures of one of the two compressible layers. A pressure is applied between the two compressible layers causing the liquid circuit element material to flow between the two compressible layers, thereby coating the at least one via of the substrate, thus providing an interconnect through the substrate. The compressed layers confine the spreading of the liquid circuit element material. This permits fabrication of large cross-sectional geometry vias for electrically connecting substrate sides with only a few simple steps. As mentioned earlier, the liquid circuit element material may optionally be comprised of a resistive, or dielectric material. These and other types of materials may be used to effectively coat the substrate's via(s). Also, this method is very useful for coating vias through thick substrates. Typically, substrates are 0.035" thick. However, using the disclosed method, vias may be coated through substrates in excess of 0.100".

What is claimed is:

1. A method for fabricating a circuit element through a substrate comprising the steps of:

providing a first compressible layer having at least one aperture disposed therethrough commencing on a first surface and continuing to an opposing second surface wherein the at least one aperture is bounded within a second area;

disposing a first surface of a substrate on the first surface of said compressible layer, wherein said substrate has at least one via disposed therethrough commencing on an opposing second surface and continuing to the first surface, wherein the at least one via is bounded within a first area on the opposing second surface and the first surface, wherein the first area is smaller than the second area associated with the at least one aperture of the first compressible layer, and wherein said disposing step aligns the at least one aperture with the at least one via;

disposing a second surface of a second compressible layer on the opposing second surface of said substrate, wherein said second compressible layer has at least a second aperture disposed commencing on an opposing first surface and continuing to the second surface, wherein the at least a second aperture is bounded within a third area on the second surface larger than the first area of the at least one via of said substrate, and wherein said disposing step aligns the at least a second aperture and the at least one via;

compressing said first compressible layer and the second compressible layer about the first surface and the opposing second surface of said substrate respectively;

disposing a coating into the at least a second aperture of said second compressible layer, wherein said coating is confined within the third area of said second compressible layer; and providing a pressure difference between the at least a second aperture, and the at least one aperture, thereby drawing the coating from the at least a second aperture, through the at least one via, and through the at least one aperture and providing an interconnect of the coating between the first and opposing second surfaces of said substrate.

2. A method in accordance with claim 1 wherein the coating is comprised of a liquid circuit element material, and wherein said substrate is cured thereby changing the liquid circuit element material from a liquid state to a solid state.

3. A method in accordance with claim 1 wherein said step of providing a first compressible layer includes providing an emulsion layer.

4. A method in accordance with claim 1 wherein said step of providing a first compressible layer includes providing a rigid layer on which a compressible emulsion layer is disposed.

5. A method in accordance with claim 4 wherein said compressible emulsion layer is disposed onto and contacting the first surface of the substrate.

6. A method for fabricating a circuit element through a substrate comprising the steps of:

providing a nesting fixture having a first surface and an opposing second surface, said nesting fixture having a first multiplicity of vias arranged in a circuit pattern disposed therethrough, wherein each via of the first multiplicity of vias is formed extending from the first surface to the opposing second surface, and wherein each via of the first multiplicity of vias has a geometric shape bounded within a first area on the first surface;

disposing a non-framed stencil on the first surface of said nesting fixture, said non-framed stencil comprises a rigid layer having a first surface contacting the first surface of said nesting fixture, and a compressible layer disposed on an opposing second surface of the rigid layer, said non-framed stencil having a second multiplicity of vias arranged in the circuit pattern disposed therethrough, wherein each via of the second multiplicity of vias is formed extending from a first surface of the compressible layer to the first surface of the rigid layer, wherein each via of the second multiplicity of vias has a geometric shape bounded by a second area on the first surface of the compressible layer, and the first surface of the rigid layer, wherein the second area is smaller than the first area associated with the first multiplicity of vias of said nesting fixture, and wherein said disposing step aligns the first and second multiplicity of vias;

disposing a substrate on the first surface of the compressible layer of said non-framed stencil, said substrate having a first surface contacting the first surface of the compressible layer of said non-framed stencil, and an opposing second surface, said substrate having a third multiplicity of vias arranged in the circuit pattern disposed therethrough, wherein each of the third multiplicity of vias is formed extending from the first surface to the opposing second surface, wherein each of the third multiplicity of vias has a geometric shape bounded by a third area on the first surface and the opposing second surface, wherein the third area is smaller than the second area associated with the second multiplicity of vias of said non-framed stencil, and wherein said disposing step aligns the second and third multiplicity of vias;

disposing a framed stencil on the opposing second surface of said substrate, said framed stencil comprises a second surface of a second compressible layer contacting the opposing second surface of said substrate, and a second rigid layer disposed on an opposing first surface of the second compressible layer, said framed stencil having a fourth multiplicity of vias arranged in the circuit pattern disposed therethrough, each via of the fourth multiplicity of vias is formed extending from the second surface of the second compressible layer to an opposing fourth surface of the second rigid layer, wherein each via of the fourth multiplicity of vias has a geometric shape bounded by an area related to the second area of each via of the second mulitplicity of vias of said nonframed stencil, and wherein said disposing step aligns the third and fourth multiplicity of vias;

compressing said nesting fixture, said non-framed stencil, said substrate, and said framed stencil, thereby compressing and compressible layer of said non-framed stencil and the compressible layer of said framed stencil about the first surface and the opposing second surface of said substrate;

disposing a liquid circuit element material into the fourth multiplicity of vias of said framed stencil, wherein said liquid circuit element material is confined within the second area of each via on the second surface of the second compressible layer of said framed stencil; and drawing a vacuum between the opposing fourth surface of the second rigid layer and the opposing second surface of said nesting fixture, thereby drawing the liquid circuit element material between the fourth multiplicity of vias, and the first multiplicity of vias and providing an interconnect between the first surface and the opposing second surface of said substrate.

7. A method in accordance with claim 6 further comprising the step of:

firing said substrate to change the liquid circuit element material from a liquid state to a solid state.

8. A method in accordance with claim 7 wherein said step of providing a first compressible layer includes providing an emulsion layer. second surface of the second compressible layer to an opposing fourth surface of the second rigid layer, wherein each via of the fourth multiplicity of vias has a geometric shape bounded by an area related to the second area of each via of the second multiplicity of vias of said non-framed stencil, and wherein said disposing step aligns the third and fourth multiplicity of vias;

compressing said nesting fixture, said non-framed stencil, said substrate, and said framed stencil, thereby compressing the compressible layer of said non-framed stencil and the compressible layer of said framed stencil about the first surface and the opposing second surface of said substrate;

disposing a liquid circuit element material into the fourth multiplicity of vias of said framed stencil, wherein said liquid circuit element material is confined within the second area of each via on the second surface of the second compressible layer of said framed stencil; and drawing a vacuum between the opposing fourth surface of the second rigid layer and the opposing second surface of said nesting fixture, thereby drawing the liquid circuit element material between the fourth multiplicity of vias, and the first multiplicity of vias and providing an interconnect between the first surface and the opposing second surface of said substrate.

\* \* \* \* \*

UNITED STATES PATENT AND TRADEMARK OFFICE
CERTIFICATE OF CORRECTION

PATENT NO. : 5,456,942

DATED : 10/10/95

INVENTOR(S) : Bebak et al.

It is certified that error appears in the above-identified patent and that said Letters Patent is hereby corrected as shown below:

In claim 8, column 9, line 25, after "layer.", delete all remaining text through column 10, line 24.

Signed and Sealed this

Ninth Day of April, 1996

*Attest:*

BRUCE LEHMAN

*Attesting Officer*     *Commissioner of Patents and Trademarks*